(12) United States Patent
Yoon

(10) Patent No.: US 6,240,191 B1
(45) Date of Patent: May 29, 2001

(54) AUDIO VOLUME CONTROL CIRCUIT USING PULSE WIDTH MODULATION SIGNAL

(75) Inventor: An Sung Yoon, Suwon (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 08/961,884

(22) Filed: Oct. 31, 1997

(30) Foreign Application Priority Data

Oct. 31, 1996 (KR) .................................................. 96-51419
Apr. 9, 1997 (KR) .................................................. 97-13081

(51) Int. Cl.[7] .................................................. H03G 3/00
(52) U.S. Cl. .................................................. 381/109; 381/104
(58) Field of Search .................................................. 381/104, 107, 381/109, 94.5; 364/400.01

(56) References Cited

U.S. PATENT DOCUMENTS

| | | |
|---|---|---|
| Re. 30,482 | 1/1981 | Whitlock . |
| 4,030,129 | 6/1977 | Whitlock . |
| 4,371,840 | 2/1983 | Yokoyama . |
| 4,390,834 | 6/1983 | Ohshita . |
| 4,433,416 | 2/1984 | Kojima . |
| 4,724,396 | 2/1988 | Taylor et al. . |
| 5,054,071 * | 10/1991 | Bacon .................................................. 381/12 |
| 5,150,415 | 9/1992 | Jaffee et al. . |
| 5,191,620 * | 3/1993 | Lee .................................................. 381/105 |
| 5,444,783 * | 8/1995 | Na .................................................. 381/57 |
| 5,613,010 * | 3/1997 | Heyl et al. .................................................. 381/117 |
| 5,666,431 | 9/1997 | Gillespie et al. . |
| 5,751,816 * | 5/1998 | Howard .................................................. 381/300 |
| 5,771,301 * | 6/1998 | Fuller et al. .................................................. 381/107 |
| 5,802,187 * | 9/1998 | Hsu .................................................. 381/119 |

* cited by examiner

*Primary Examiner*—Forester W. Isen
*Assistant Examiner*—Brian Tyrone Pendleton
(74) *Attorney, Agent, or Firm*—Robert E. Bushnell, Esq.

(57) ABSTRACT

An audio level control circuit uses pulse width modulated signals to regulate the output level of an audio signal. As a user pushes an up key or a down key, a pulse width modulated signal having a variable duty ratio is generated in a pulse width modulation signal generator. A rectifier then transforms the pulse width modulated signal into a DC level. An audio signal level regulating integrated circuit comparatively expands the audio signal level provided to an audio signal input circuit and the DC level provided by a rectifier, and regulates the audio signal level. The audio signal level regulated in the audio signal level regulating integrated circuit does not include noise when used for a long time, as it has been processed in an audio signal processor and has been provided through an audio output circuit. A popping noise is not experienced during muting since the pulse width of the output of the pulse width modulation signal generator is regulated.

16 Claims, 4 Drawing Sheets

AUDIO VOLUME CONTROL CIRCUIT USING PULSE WIDTH MODULATION SIGNAL

CLAIM FOR PRIORITY

This application refers to, claims all rights of priority accruing under 35 U.S.C. §119, and incorporates the same by reference herein, my applications entitled Audio Volume Control Circuit Using Pulse Width earlier filed in the Korean Industrial Property Office on the Oct. 31, 1996 and there assigned Ser. No. 1996/51419, and earlier filed in the Korean Industrial Property Office on Apr. 9, 1997 and there assigned Ser. No. 1997/13081.

BACKGROUND OF THE INVENTION

1. Technical Field

This invention relates generally to an audio volume control process and circuit using a pulse width modulation (PWM) signal that is generated with a variable duty ratio according to the users operation, and regulates the output level of the audio signal.

2. Related Art

Audio output appliances, like television sets and audio systems, usually amplify and output the audio signal with an amplifier. The audio output appliances have built-in volume controllers, and the audio signal level is regulated and put out according to the volume controller operated by the user.

Recently, with the development of computer technology, multi-media technology has employed such a technique so that various audio signals are put out with an audio card in the computer system. An example of this is found in various computer games, wherein audio signals are produced according to the process of the game with audio cards. Exemplars of recent efforts in the art are found among the designs and processes described, for example, in U.S. Pat. No. 5,666,431 to Gillespie et al, entitled volume Control For A Personal Computer Internal Speaker, U.S. Pat. No. 5,150,415 to Jaffee et al, entitled Volume Control Circuit Using Pulse Modulation, U.S. Pat. No. 4,724,396 to Taylor Jr., et al., entitled Digital Audio Amplifier, U.S. Pat. No. 4,433,416 to Kojima, entitled PCM Signal Processor, U.S. Pat. No. 4,390,834 to Ohshima, entitled Digital Volume Control, U.S. Pat. No. 4,371,840 to Yokoyama, entitled Gain Control Circuit For Pulse Width Modulation Amplifier, U.S. Pat. No. Re. 30,482 to Whitlock, entitled Pulse Code Modulated Digital Audio system, entitled Pulse Code Modulated Digital Audio System, and U.S. Pat. No. 4,030,129 to Whitlock, entitled Pulse Code Modulated Digital Audio system.

While playing compact disks (CDS) or audio or video compact disks (VCDs) in the compact disk-read only memory (CD-ROM) drive attached to a computer system, the audio signal from the CDS or VCDs will be put out from the audio card. As the audio cards putting out the audio signal have been attached to the computer system, the monitor, which has been used only as the output screen or display of the computer system, not only expresses a certain image, but also amplifies the audio signal provided by the computer system and puts it out through a speaker. The monitor also has a built-in volume controller regulating the volume output, and the level of the audio signal will be varied and be put out as a user regulates the volume controller. Thus, a variable resistor has conventionally been used as a volume controller in order to control the level of the audio signal put out by the audio output appliances and the computer system.

I have found that such conventional variable resistors having been burdened by disadvantages when used as a volume controller. For example, as explained in more detail below, such variable resistors are such that is difficult to regulate the signal level of audio signals passing through such variable resistors. In addition, due to errors associated with the variable resistors, a uniform signal-to-noise ratio is difficult to obtain. Furthermore, as such variable resistors are used over a period of time, they can become attenuated or can cause noise due to dust or humidity. Finally, in such conventional arrangements, the user can be disturbed due to the occurrence of a popping noise when the speakers are muted.

SUMMARY OF THE INVENTION

It is therefore, one object of the present invention to supply an improved audio level control process and circuit.

It is another object to provide and audio level control process and circuit able to regulate the output level of the audio signal by using pulse width modulated signals that have a variable duty ratio according to the operation of the user.

It is still another object to provide a volume control process and controller to regulate the level of the audio signal produced by the audio card of a computer system.

It is yet another object to provide a volume control process and controller to regulate the level of the audio signal produced by the audio card of a computer system with a micro-computer implemented in a monitor, and pulse width modulated signals exhibiting a variable duty ratio according to the operation of the user.

These and other objects may be attained with a micro-computer implemented in a monitor, using pulse width modulated signals having a variable duty ratio established according to the operation of the user. The pulse width modulated signal generator creates pulse width modulated signals with a variable duty ratio, and a rectifier transforms the pulse width modulated signals into DC level signals and puts them out as the user operates an up key or a down key.

The pulse width modulation signal generator creates pulse width modulated signals with a variable duty ratio with the help of a separate pulse width modulation signal generator as the up or down key is operated, or as the micro-computer governing the operation of a monitor functions in accordance with the up or the down key.

The audio signal level regulating integrated circuit comparatively amplifies the DC level put out by the rectifier, and controls the audio signal level, and the audio signal put out by the integrated circuit with a regulated level is put out through an audio output means after having been processed in an audio signal processor. Therefore, noise will not arise during use of the appliance for a long time, even though the output level of the audio signal is varied electrically. Moreover, in muting the audio signal, pop noises will not arise since the duty ratio of the pulse width modulated signal put out by the pulse width modulation signal generator is regulated.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
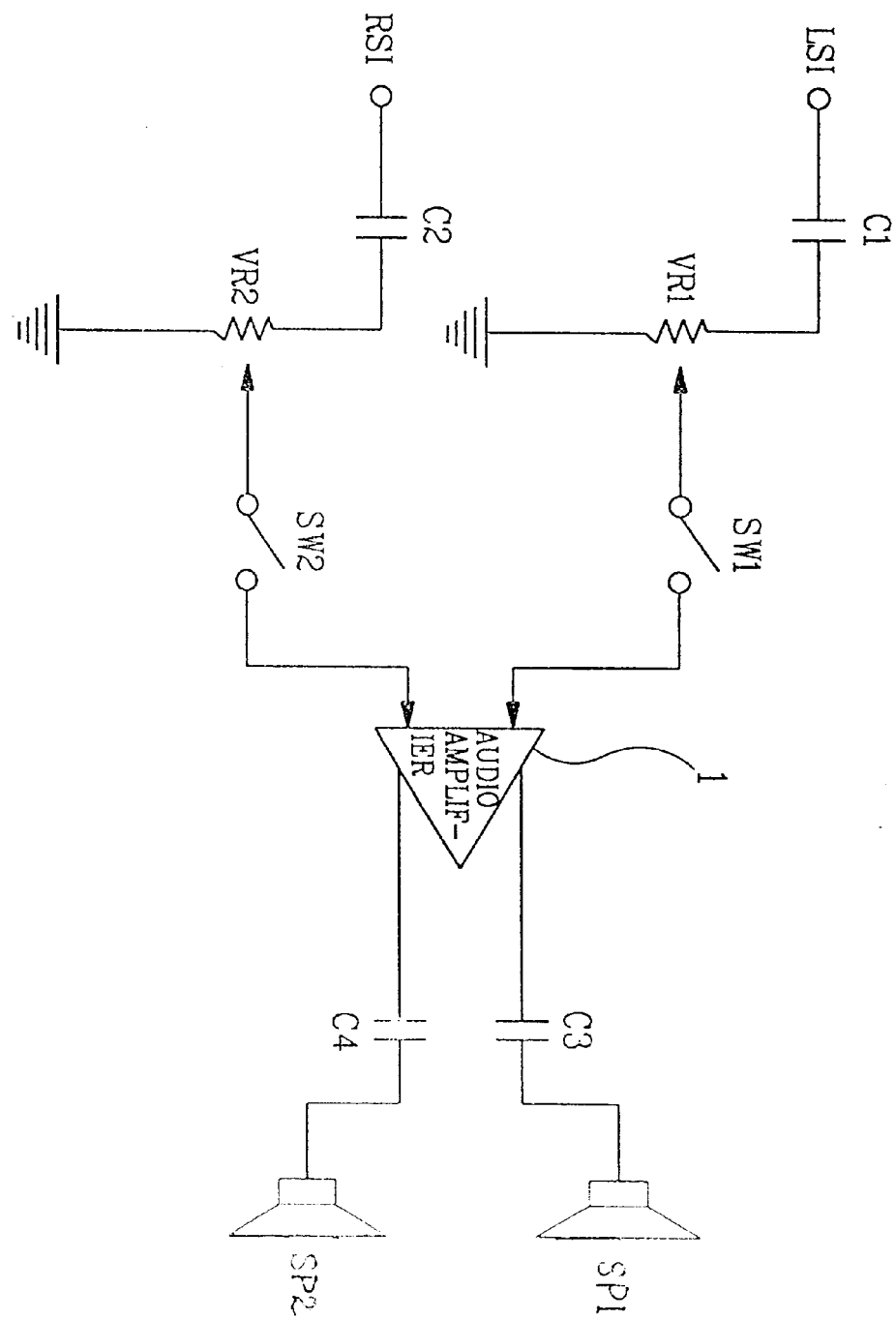
FIG. 1 is a circuit diagram of a conventional volume controller.

Conventional technology will be explained in detail with reference to FIG. 1, which depicts a conventional audio volume control circuit regulating the output level of the audio signal by using a variable resistor as the volume controller. LSI and RSI are audio signal input terminals for input of audio signals for the L-channel and the R-channel, respectively. The audio signal input terminals LSI and RSI are connected to the variable resistors VR1 and VR2, respectively, through the capacitors, C1 and C2, respectively. The variable terminals of the resistors VR1 and VR2 are connected to the respective input terminals of the audio amplifier 1 through the mute switches SW1 and SW2, respectively. The output terminals of the audio amplifier 1 are connected, via respective capacitors C3 and C4, to the speakers SP1 and SP2, respectively, which put out the audio signals for the L-channel and the R-channel, respectively.

In the conventional audio volume control circuit structured as has been explained, the audio input signals for the L-channel and the R-channel will be put into the audio signal input terminals LS1 and RS1, respectively. The audio input signals for the L-channel and the R-channel put into the audio signal input terminals LS1 and RS1, respectively, pass through respective capacitors, C1 and C2, and are provided to the audio amplifier 1 through the respective mute switches SW1 and SW2 after the level has been set with the respective variable resistors VR1 and VR2 controlled by the user. Then, the audio amplifier 1 amplifies each audio signal input for the L-channel and the R-channel, and puts it out to a respective one of the speakers SP1 and SP2 through respective capacitors C3 and C4 so that the user can hear it.

The mute switches SW1 and SW2 operate according to a mute control signal produced by a controller, such as a micro-computer, as operated by a user, or as the user operates respective mute keys (not shown in the figure). If the mute switches SW1 and SW2 are open, the audio signal will be disconnected and will not be put out. That is to say, in the conventional technology, the audio signal level of the L-channel and the R-channel will be varied and put out in accordance with operation of the variable resistors VR1 and VR2 by the user.

However, as the audio signal is varied through the variable resistor and the level is regulated, it is hard to exactly regulate the inconstant range. In addition, a uniform signal to noise ratio cannot be obtained due to error associated with the variable resistors VR1 and VR2. Moreover, as appliances are used for a long time, the variable resistors VR1 and VR2 will be attenuated, or can cause noise because of dust or humidity.

Furthermore, since the audio signal is muted when the mute switches SW1 and SW2 are open, the audio signal will be disconnected at a moment when the audio signal is muted under the condition that the audio signal is put in, amplified and put out through the audio amplifier 1. Therefore, in muting, the user will be disturbed because of a popping noise, and the reliability of the appliance will be reduced.

The volume controller circuit using pulse width modulated signals in accordance with the present invention will now be explained in detail referring to FIG. 2 or FIG. 4.

Figure 2:
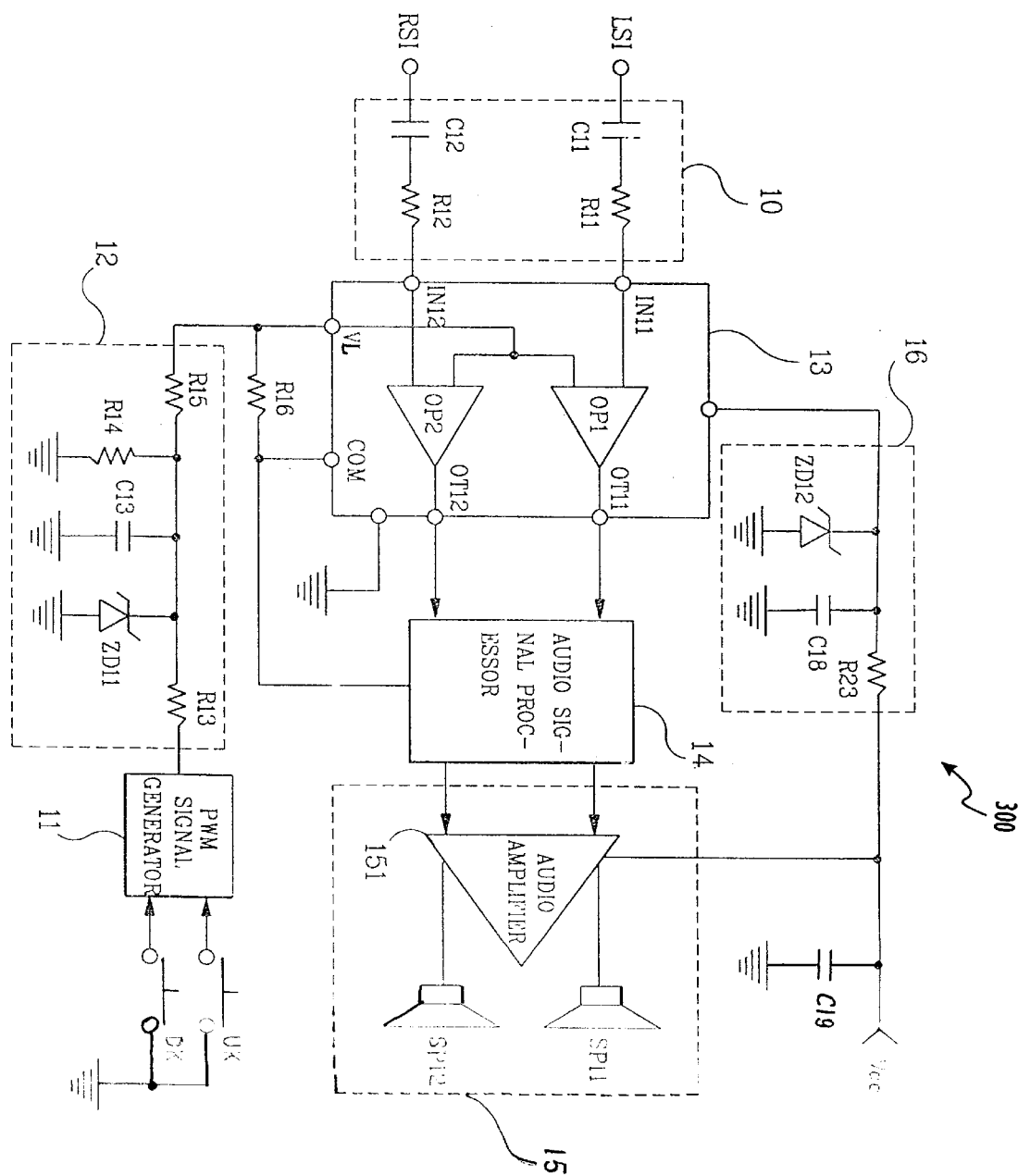
FIG. 2 is a circuit diagram of a volume controller of the present invention.

FIG. 2 generally depicts the circuit diagram of a volume controller of this invention. The volume controller 300 has an audio signal input stage 10 for receiving the audio signal of the L-channel and the R-channel through the respective audio signal input terminals LSI and RSI from the computer system, a pulse width modulation signal generator 11 producing a pulse width modulated signal with a variable duty ratio as the up key (UK) or down key (DK) is used, a rectifier 12 for transforming the pulse width modulated signal produced by the pulse width modulation signal generator 11 into a DC level signal, an audio signal level regulating integrated circuit 13 for controlling the level of the audio signals of the L-channel and the R-channel input via the audio signal input stage 10 according to the output level of the rectifier 12, an audio signal processor 14 for processing the audio signal, the level of which is regulated in the audio signal level regulating integrated circuit 13, an audio signal output stage 15 for putting out the amplified audio signals provided by the audio signal processor 14, and a power supply 16 for supplying stabilized power.

In the audio signal input stage 10, the audio signals of the L-channel and the R-channel input via the respective audio signal input terminals LSI and RSI are provided to the input terminals IN11 and IN12, respectively, of the audio signal level regulating integrated circuit 13 via respective capacitor C11 and C12 which are serially connected to resistors R11 and R12, respectively.

In the rectifier 12, the output terminal of the pulse width modulation signal generator 11 is connected to the cathode of the voltage regulator diode ZD11, the grounded capacitor C13 and the grounded resistor R14 via the resistor R13. The contact point of the cathode of the voltage regulator diode ZD11, the capacitor C13 and the resistor R14 are then connected to the level regulating terminal VL of the audio signal level regulating integrated circuit 13 via the resistor R15.

Figure 3:
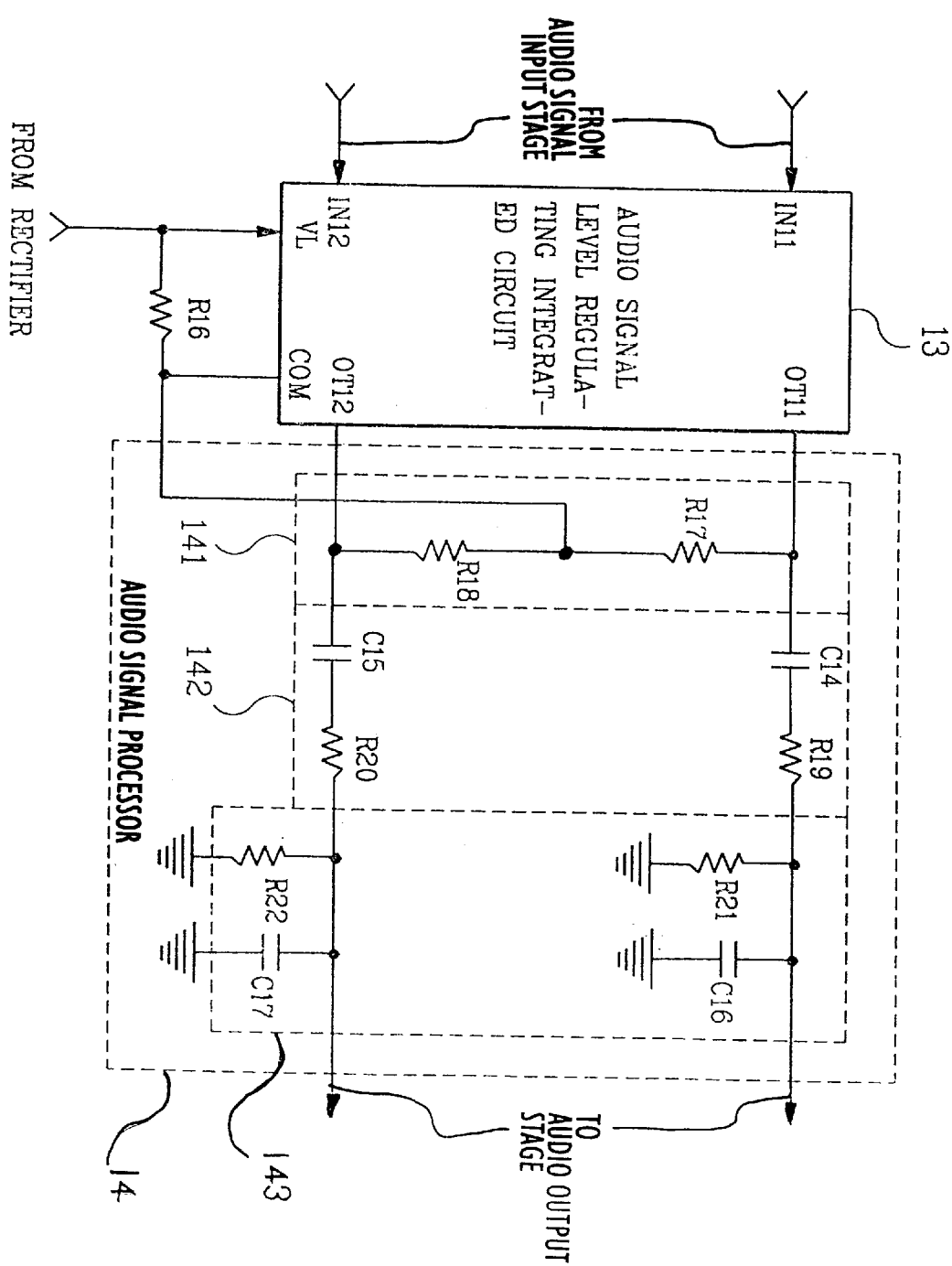
FIG. 3 is a detailed circuit diagram showing the structure of the audio signal processor of FIG. 2.

Referring to FIG. 3, the audio signal processor 14 has input terminals connected to the output terminals OT11 and OT12 of integrated circuit 13 so as to receive the audio signals from the L-channel and R-channel via resistors R17 and R18 placed between those input terminals. The remote terminals of resistors R17 and R18 are connected together, and the junction so formed is connected to the COM terminal of the audio signal level regulating integrated circuit 13, and to the VL terminal of the integrated circuit 13 via a resistor R16. The audio signal processor also comprises an audio signal level detector 141. The audio signal coupling block 142 comprises the capacitors C14 and C15 in series with the resistors R19 and R20, respectively, each series-connected pair C14, R19 and C15, R20 being serially connected to the output terminals OT11 and OT12, respectively, and to the resistors R17 and R18, respectively, of audio signal level detector 141.

The impedance regulating/low-pitched sound compensator 143 comprises grounded resistors R21 and R22 and grounded capacitors C16 and C17 connected between the respective output terminals of audio signal coupling block 142 and the respective input terminals of the audio amplifier 151 of the audio output stage 15 (FIG. 2), the amplifier 151 driving speakers SP11 and SP12.

In the power supply 16, a grounded capacitor C18, the cathode of a voltage regulator diode ZD12 and a resistor R23 are connected between the power terminal of the integrated audio signal level regulating device 13 and a grounded capacitor C19. Capacitor C19 stabilizes supply voltage Vcc prior to input to the audio amplifier 151 of the audio output stage 15.

In addition, supply voltage Vcc is provided to the power input terminal of the integrated audio signal level regulating device 13 after passing through resistor R23 and capacitor C18 of the power supply 16, as well as the voltage regulator diode ZD12, which transforms it into a stabilized voltage. Thus, stabilized voltage is applied to the power terminal of the audio signal level regulating integrated circuit 13 as operating power.

Under this condition, the audio signal of the L-channel and the R-channel is provided to the audio signal input stage 10 through the audio signal input terminals LSI and RSI, and the audio signal is further provided to the input terminals IN11 and IN12 of the integrated audio signal level regulating circuit 13 after passing through capacitors C11 and C12 and resistors R11 and R12 of the input stage 10.

Then, the audio signal level regulating integrated circuit 13 regulates the level of the audio signal of the L-channel and the R-channel according to the DC level permitted by the operating amplifiers OP11 and OP12 in accordance with the input at level regulating terminal VL, and then outputs the regulated audio signals at the output terminals OT11 and OT12.

The regulated audio signal output current at terminals OT11 and OT12 is then provided to the resistors R17 and R18 of the audio signal level detector 141 of the audio signal processor 14 (FIG. 3), and is transformed into a voltage.

The audio signal level regulating integrated circuit 13 also regulates the level of the power voltage provided to its power terminal by power supply 16 (FIG. 2), and outputs it to the common terminal COM. The modified level of the power voltage provided to the common terminal COM is then provided to the level regulating terminal VL of the audio signal level regulating integrated circuit 13 (FIG. 3), and then, through the resistor R16, to the contact point of the resistors R17 and R18, and is used to regulate the output level of the audio signal.

The audio signal is transformed into a voltage through the resistors R17 and R18, and is inserted into the impedance regulating/low-pitched sound compensator 143 through the resistors R19 and R20 and the capacitors C14 and C15 of the audio coupling unit 142 of the audio signals processor 14. Thereby, the audio signal is revised to a regular level through the resistors R19 and R20 so that distortion in the case of a high level of the audio signal can be compensated.

The audio signal output of the audio signal coupling unit 142 of the audio signal processor 14 is impedance-matched via resistors R21 and R22 of the impedance regulating low-pitched sound compensator 143. This means that the impedances of the audio signal level regulating integrated circuit 13 and the audio output stage 15 are matched through the resistors R21 and R22.

The audio signal with its impedance regulated through the resistors R21 and R22 is provided to the capacitors C16 and C17 with the added low-pitched sound frequency band. The audio signal of the L-channel and the R-channel processed in the audio signal processor 14 is amplified in the audio amplifier 151 of the audio output stage 15, and is then provided to the speakers SP11 and SP12.

The pulse width modulation signal generator 11 provides pulse width modulated signals having a variable duty ratio according to the operation of the UK or the DK when a user operates the UK or the DK to regulate the output level of the audio signal. That is, in the pulse width modulation signal generator 11, pulse width modulated signals having a larger duty ratio are put out as the user pushes the UK, and pulse width modulated signals having a smaller duty ratio are put out as the user pushes the DK. As has been explained above, the pulse width modulated signal put out by the pulse width modulation signal generator 11 goes through the resistor R13 of the rectifier 12, is transformed into a DC level signal by the capacitor C13, is level-regulated through the resistors R14 and R15, and is provided to the level regulating terminal VL of the audio signal level regulating integrated circuit 13. The voltage regulator diode ZD11 is provided in rectifier 12 to eliminate the surge voltage.

Operational amplifiers OP1 and OP2 of the audio signal level regulating integrated circuit 13 regulate the audio signal level according to the DC level permitted by the input to level regulating terminal VL, and the regulated output is provided to audio signal processor 14.

That is to say, the DC level permitted by the input to level regulating terminal VL is expanded when the user pushes the UK, and therefore the pulse width modulation signal generator 11 produces pulse width modulated signals with a large duty ratio, and the audio signal level regulating integrated circuit 13 puts out a loud audio signal level.

Conversely, the DC level permitted by the input to level regulating terminal VL is diminished when the user pushes the DK; therefore, the pulse width modulation signal generator 11 generates pulse width modulated signals having a small duty ratio, and the audio signal level regulating integrated circuit 13 puts out a quiet audio signal level.

Figure 4:
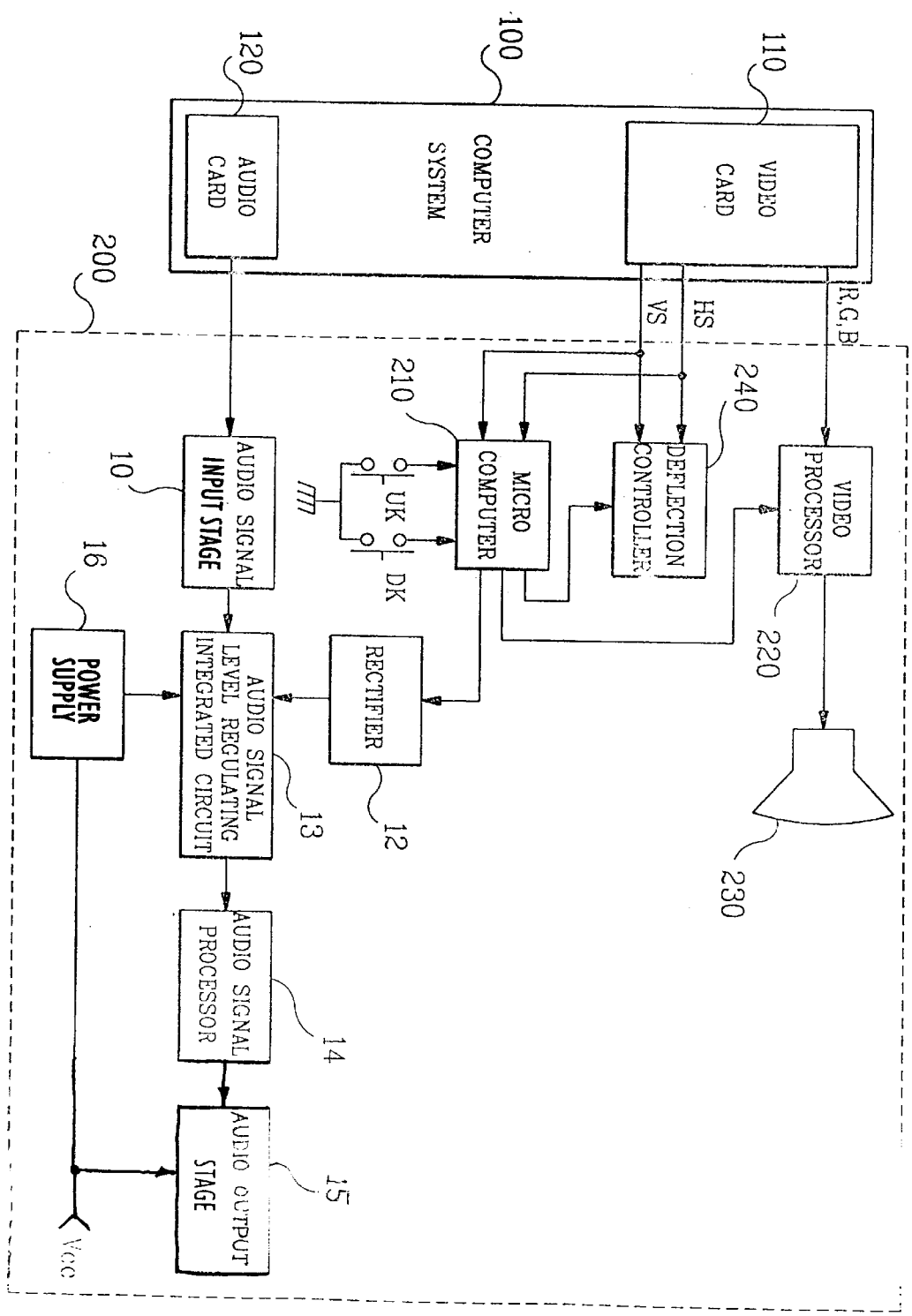
FIG. 4 is a circuit diagram showing an embodiment with the volume controller circuit incorporated into a monitor.

FIG. 4 is a circuit diagram of a preferred embodiment of the invention, applying an audio level control circuit to the monitor. The computer system is designated by reference numeral 100, and the monitor is designated by reference numeral 200. The computer system 100 is equipped with a video card 110 and an audio card 120.

The video card 110 in the computer system 100 puts out the color signals R, G and B displayed on the monitor 200, the horizontal synchronous signal HS, and the vertical synchronous signal VS.

The monitor 200 comprises a microcomputer 210 generating pulse width modulated signals with a variable duty ratio as the user pushes the UK or the DK, and the movement of the monitor is controlled. Monitor 200 also includes a video processor 220 which processes the color signals R, G and B provided by video card 110, and applies corresponding output signals to cathode-ray tube 230 under the control of the micro-computer 210. Monitor 200 further includes deflection controller 240 for correcting a distorted image caused by the deflection of the cathode-ray tube 230 in accordance with a control input from micro computer 210 and the horizontal synchronous signal HS and the vertical synchronous signal VS provided by the video card 110 of the computer system 100.

The audio signal provided by the audio card 120 of the computer system 100 is input to the audio signal input stage 10, and the rectifier 12 rectifies the pulse width modulated signals put out by the micro-computer 210 and regulates the audio signal level.

In this invention, the video card 110 puts out the horizontal synchronous signal HS, the vertical synchronous signal VS, and the color signals R, G and B when the computer system 100 is operated. The audio card 120 in the computer system 100 puts out the audio signal of the L-channel and the R-channel.

The color signals R, G and B are provided to the video processor 220 of the monitor 200, and the horizontal and the vertical synchronous signals HS and VS are provided to both the deflection controller 240 and the micro computer 210 of the monitor 200.

The modes of the color signals R, 6 and B put out by the video card 110 are interpreted by the micro computer 210 in accordance with the cycle of the horizontal and vertical synchronous signals HS and VS, respectively. This means that the micro-computer 210 interprets whether the color signals R, G and B are put out in the CGA mode, VGA mode, or SVGA mode, and it puts out the control signal according to the result.

Then, the video processor 220 processes the color signals R, G and B provided by the video card 110 according to the control signal put out by the micro-computer 210, and provides an output to the cathode-ray tube 230.

The deflection controller 240 deals with the horizontal and the vertical synchronous signals HS and VS, respectively, as provided by the video card 110, controls the deflection of the cathode-ray tube 230, and displays a certain video.

The audio signal provided by the audio card 120 of the computer system 100 is provided to the audio signal level regulating integrated circuit 13 via the audio signal input stage 10.

Under this condition, when the user pushes the UK or the DK, the micro-computer 210 puts out pulse width modulated signals with a variable duty ratio. The pulse width modulated signals provided by the micro-computer 210 are rectified in the rectifier 12, are transformed into a DC level signal, and are provided to the audio signal level regulating integrated circuit 13.

The audio signal provided by the audio signal level regulating integrated circuit 13 is processed in the audio signal processor 14, and is provided as an output by the audio output stage 15.

As has been explained in detail above, the audio signal level is regulated and put out electrically so that the output level of the audio signal is regulated easily, the volume is regulated exactly and without noise when using it for a long time, and the regulation of the volume is stabilized and performed.

In addition, popping noise does not arise as the duty ratio of the pulse width modulated signal provided by the pulse width modulation signal generating means is regulated and muted when the audio signal is muted.

What is claimed is:

1. An audio level control circuit using pulse width modulation, comprising:
   audio signal input means for receiving an audio signal;
   operator input means responsive to operator actuation for providing an operator control output;
   pulse width modulation signal generator means connected to said operator input means and responsive to the operator control output thereof for producing pulse width modulated signals having a variable duty ratio in accordance with the operator control output;
   rectifier means connected to said pulse width modulation signal generator means for transforming the pulse width modulated signals generated by said pulse width modulation signal generator means into a DC level, and producing an output;
   audio signal level regulating integrated circuit means connected to said rectifier means and to said audio signal input means for regulating a level of the audio signal according to the output of said rectifier means and producing an audio output;
   audio signal processor means connected to said audio signal level regulating integrated circuit means for processing the audio output thereof to produce an audio signal output; and
   audio output means connected to said audio signal processor means for amplifying the audio signal output of said audio signal processor means;
   wherein said audio signal processor means comprises an audio signal level detector for detecting an audio signal level of the audio output of said audio signal level regulating integrated circuit means, for regulating the detected audio signal level, and for feeding the regulated audio signal level back into said audio signal regulating integrated circuit means.

2. The circuit of claim 1, wherein said operator input means comprises an up key and a down key connected to said pulse width modulation signal generator means, and wherein said pulse width modulation signal generator means produces the pulse width modulated signals as one of the up key and the down key is pushed with the use of a micro-computer.

3. The circuit of claim 1, wherein said rectifier means comprises:
   a resistor and a capacitor for transforming the pulse width modulated signals generated by said pulse width modulation signal generator means into the DC level; and
   a level regulating circuit connected to said resistor and said capacitor for regulating the DC level.

4. The circuit of claim 3, wherein said rectifier means further comprises a voltage regulator diode for eliminating a surge voltage.

5. The circuit of claim 1, wherein said audio signal processor means further comprises:
   an audio signal coupling unit connected to said audio signal level detector for regulating the audio signal level provided by said audio signal level detector, and producing an output; and
   a regulating/low-pitched sound compensator, which is impedance-matched with the output of said audio signal coupling unit, for reinforcing a low frequency substitute and providing said audio signal output.

6. An audio level control circuit using pulse width modulation, comprising:
   audio signal input means for receiving an audio signal from an audio card of a computer system;
   operator input means responsive to operator actuation for providing an operator control output;
   micro-computer means connected to said operator input means and responsive to the operator control output thereof for generating pulse width modulated signals having a variable duty ratio as movement of a monitor is controlled and the operator control output is received;
   rectifier means connected to said micro-computer means for transforming the pulse width modulated signals into a DC level and producing an output;
   audio signal level regulating integrated circuit means having an input connected to said audio signal input means, and having a level-regulating input terminal connected to the output of said rectifier means for regulating a level of the audio signal according to the output of said rectifier means;
   audio signal processor means connected to said audio signal level regulating integrated circuit means for processing an audio output thereof to produce an audio signal output; and audio signal output means connected to said audio signal processor means for amplifying the audio signal output of said audio signal processor means.

7. The circuit of claim 6, wherein said rectifier means comprises:
- a resistor and a capacitor for transforming the pulse width modulated signals generated by said micro-computer means into the DC level; and
- a level regulating circuit connected between said resistor and said capacitor, on one side, and the level-regulating input terminal of said audio signal level regulating integrated circuit means, on another side, for regulating the DC level.

8. The circuit of claim 7, wherein said rectifier means further comprises a voltage regulator diode connected between said micro-computer means and said resistor, on one side, and said capacitor, on another side, for eliminating a surge voltage.

9. The circuit of claim 6, wherein said audio signal processor means comprises:
- an audio signal level detector for detecting an audio signal level of the audio output of said audio signal level regulating integrated circuit means, for regulating the detected audio signal level, and for feeding the regulated audio signal level back into said audio signal level regulating integrated circuit means;
- an audio signal coupling unit connected to said audio signal detector for regulating the audio signal level provided by said audio signal level detector, and producing an output; and
- a regulating/low-pitched sound compensator, which is impedance-matched with the output of said audio signal coupling unit, for reinforcing a low frequency substitute and providing said audio signal input.

10. An audio level control circuit using pulse width modulation, comprising:
- audio signal input means for receiving an audio signal;
- operator input means responsive to operator actuation for providing an operator control output;
- pulse width modulation signal generator means connected to said operator input means and responsive to the operator control output there of for producing pulse width modulated signals having a variable duty ratio in accordance with the operator control output;
- audio signal processor means connected to said audio signal input means and to said pulse width modulation signal generator means for processing said audio signal so as to regulate a level of the audio signal and to produce an audio signal output; and
- audio output means connected to said audio signal processor means for amplifying the audio signal output of said audio signal processor means;
- wherein said audio signal processor means comprises a rectifier connected to said pulse width modulation signal generator means for transforming the pulse width modulated signals generated by said pulse width modulation signal generator means into a DC level, and producing an output, and a signal processor for regulating a level of the audio signal from said audio signal input means according to the output of said rectifier so as to produce an audio signal output; and
- wherein said signal processor comprises an audio level detector for detecting an audio signal level corresponding to said audio signal from said audio signal input means, for regulating the detected audio signal level, and for providing the regulated audio signal level as an output, and an audio signal coupling unit connected to said audio signal detector for regulating the audio signal level provided by said audio signal level detector, and producing an output.

11. The circuit of claim 10, wherein said signal processor further comprises an audio signal level regulating integrated circuit connected to said rectifier and to said audio signal input means for regulating the level of the audio signal according to the output of said rectifier, and producing an audio output.

12. The circuit of claim 11, wherein said signal processor further comprises:
- a regulating/low-pitched sound compensator, which is impedance-matched with the output of said audio signal coupling unit, for reinforcing a low frequency substitute and providing said audio signal output.

13. The circuit of claim 10, wherein said signal processor further comprises:
- a regulating/low-pitched sound compensator, which is impedance-matched with the output of said audio signal coupling unit, for reinforcing a low frequency substitute and providing said audio signal output.

14. The circuit of claim 10, wherein said operator input means comprises an up key and a down key connected to said pulse width modulation signal generator means, and wherein said pulse width modulation signal generator means produces the pulse width modulated signals as one of the up key and the down key is pushed with the use of a micro-computer.

15. An audio level control circuit using pulse width modulation, comprising:
- audio signal input means for receiving an audio signal;
- operator input means responsive to operator actuation for providing an operator control output;
- pulse width modulation signal generator means connected to said operator input means and responsive to the operator control output thereof for producing pulse width modulated signals having a variable duty ratio in accordance with the operator control output;
- audio signal processor means connected to said audio signal input means and to said pulse width modulation signal generator means for processing said audio signal so as to regulate a level of the audio signal and to produce an audio signal output; and
- audio output means connected to said audio signal processor means for amplifying the audio signal output of said audio signal processor means;
- wherein said audio signal processor means comprises a rectifier connected to said pulse width modulation signal generator means for transforming the pulse width modulated signals generated by said pulse width modulation signal generator means into a DC level, and producing an output, a signal regulator for regulating a level of the audio signal from said audio signal input means according to the output of said rectifier so as to produce a regulated output, an audio signal coupling unit for receiving and coupling the regulated output to produce a coupler output, and a regulated low-pitched sound compensator is impedance-matched with the coupler output of said audio signal coupling unit for reinforcing a low frequency substitute and providing said audio signal output.

16. The circuit of claim 15, wherein said signal regulator comprises an audio signal level regulating integrated circuit.

* * * * *